(12) United States Patent
Stigler et al.

(10) Patent No.: US 10,497,990 B2
(45) Date of Patent: Dec. 3, 2019

(54) MEASUREMENT SYSTEM FOR DETERMINING THE STATE OF A BATTERY

(71) Applicant: Bayerische Motoren Werke Aktiengesellschaft, Munich (DE)

(72) Inventors: Peter Stigler, Erding (DE); Michael Hallmannsegger, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 340 days.

(21) Appl. No.: 15/434,093

(22) Filed: Feb. 16, 2017

(65) Prior Publication Data

US 2017/0162918 A1 Jun. 8, 2017

Related U.S. Application Data

(63) Continuation of application No. PCT/EP2015/069112, filed on Aug. 20, 2015.

(30) Foreign Application Priority Data

Sep. 10, 2014 (DE) ........................ 10 2014 218 131

(51) Int. Cl.
*H01M 10/48* (2006.01)
*G01R 31/379* (2019.01)
(Continued)

(52) U.S. Cl.
CPC ........ *H01M 10/482* (2013.01); *G01R 31/379* (2019.01); *G01R 31/3835* (2019.01);
(Continued)

(58) Field of Classification Search
CPC ............... H01M 10/482; H01M 10/10; H01M 10/4257; H01M 2/206; H01M 10/06;
(Continued)

(56) References Cited

U.S. PATENT DOCUMENTS 4,053,824 A 10/1977 Dupuis et al.
6,091,246 A 7/2000 Saigo et al.
(Continued)

FOREIGN PATENT DOCUMENTS

CN 2713660 Y 7/2005
CN 1677788 A 10/2005
(Continued)

OTHER PUBLICATIONS

Chinese-language Office Action issued in counterpart Chinese Application No. 201580033963.4 dated Aug. 15, 2018 with English translation (19 pages).
(Continued)

*Primary Examiner* — Amy He
(74) *Attorney, Agent, or Firm* — Crowell & Moring LLP

(57) ABSTRACT

A lead-acid battery has a plurality of individual cells and a plurality of measurement circuits which are mounted on the respective individual cells in a manner integrated in the lead-acid battery. Each measurement circuit is designed to measure a respective individual cell voltage. A method is provided for measuring individual cell voltages of the lead-acid battery having the plurality of measurement circuits integrated in the battery and arranged on the individual cells. In the method, the respective individual cell voltages are measured using the measurement circuits.

14 Claims, 3 Drawing Sheets

(51) Int. Cl.
| | |
|---|---|
| *G01R 31/396* | (2019.01) |
| *H01M 10/06* | (2006.01) |
| *H01M 10/10* | (2006.01) |
| *H01M 10/42* | (2006.01) |
| *G01R 31/3835* | (2019.01) |
| *H01M 2/20* | (2006.01) |
| *H02J 7/00* | (2006.01) |
| *H01R 11/28* | (2006.01) |

(52) U.S. Cl.
CPC ......... *G01R 31/396* (2019.01); *H01M 2/206* (2013.01); *H01M 10/06* (2013.01); *H01M 10/10* (2013.01); *H01M 10/4257* (2013.01); *H02J 7/0047* (2013.01); *H01M 2010/4278* (2013.01); *H01M 2220/20* (2013.01); *H01R 11/288* (2013.01); *H02J 7/0011* (2013.01); *Y02E 60/126* (2013.01); *Y02P 70/54* (2015.11); *Y02T 10/7016* (2013.01)

(58) Field of Classification Search
CPC ...... H01M 2220/20; H01M 2010/4278; G01R 31/3835; G01R 31/396; G01R 31/379; H02J 7/0047; H02J 7/0011; Y02P 70/54; Y02T 10/7016; Y02E 60/126; H01R 11/288
See application file for complete search history.

(56) References Cited

U.S. PATENT DOCUMENTS

| | | | | |
|---|---|---|---|---|
| 6,194,901 | B1* | 2/2001 | Carton | ................ G01R 31/396 324/434 |
| 2004/0038123 | A1 | 2/2004 | Hisamitsu et al. | |
| 2004/0251876 | A1* | 12/2004 | Bertness | ............... H02J 7/0054 320/136 |
| 2010/0021809 | A1 | 1/2010 | Froeschl et al. | |

FOREIGN PATENT DOCUMENTS

| | | |
|---|---|---|
| CN | 101369005 A | 2/2009 |
| CN | 202103142 U | 1/2012 |
| DE | 195 45 833 A1 | 6/1997 |
| DE | 603 14 825 T2 | 3/2008 |
| EP | 1 533 882 A2 | 5/2005 |

OTHER PUBLICATIONS

International Search Report (PCT/ISA/210) issued in PCT Application No. PCT/EP2015/069112 dated Nov. 9, 2015 with English translation (five pages).

German-language Written Opinion (PCT/ISA/237) issued in PCT Application No. PCT/EP2015/069112 dated Nov. 9, 2015 (six pages).

German Search Report issued in counterpart German Application No. 10 2014 218 131.3 dated May 18, 2015 with partial English translation (12 pages).

Chinese Office Action issued in Chinese counterpart application No. 201580033963.4 dated May 27, 2019, with partial English translation (Sixteen (16) pages).

Cao Ying et al., "Wind Power Technology and Application", 3 total pages, China Railroad Press, Aug. 31, 2013.

* cited by examiner

MEASUREMENT SYSTEM FOR DETERMINING THE STATE OF A BATTERY

CROSS REFERENCE TO RELATED APPLICATIONS

This application is a continuation of PCT International Application No. PCT/EP2015/069112, filed Aug. 20, 2015, which claims priority under 35 U.S.C. § 119 from German Patent Application No. 10 2014 218 131.3, filed Sep. 10, 2014, the entire disclosures of which are herein expressly incorporated by reference.

BACKGROUND AND SUMMARY OF THE INVENTION

The invention relates to a lead-acid battery having a plurality of individual cells.

A conventional lead-acid battery comprises at least six plate blocks or cells which are connected in series. Each cell has a voltage of approximately 2 volts. When connected in series in a standard starter battery, the cells deliver a terminal voltage of approximately 12 volts.

The cells have a positive electrode contact and a negative electrode contact, the so-called connectors, on their top side. The electrode contacts each comprise comb-like contact elements. A plurality of positive and negative plates are interconnected with the aid of the electrode contacts to form plate sets. The parallel connection of the individual plates results in an increase in surface size, this allowing a higher capacitance and current-carrying capability of the arrangement. The plate sets are pushed one into the other to form a plate block. Each plate block comprises a positive plate set with a positive electrode contact and a negative plate set with a negative electrode contact. A negative plate includes an electrode grid which is composed of lead. The negative grid also has an electrode contact element which is part of the negative electrode contact. The negative plate has an active material layer which is composed of amorphous lead which sheaths the negative grid. A positive plate usually has, if the lead-acid battery is designed as an absorbent glass mat battery, an absorbent microglass mat layer which serves as a separator in order to separate the negative and the positive plate and thereby prevent a short circuit between the two plates. Furthermore, the positive plate also has a positive electrode grid which is composed of lead. The positive electrode grid likewise includes an electrode contact element. The positive grid is encased by a lead oxide layer as active material, said lead oxide layer for its part being surrounded by the absorbent microglass mat layer. The glass-fiber separators bind the electrolyte, the sulfuric acid, so that it is no longer moveable, that is to say cannot flow out.

As an alternative, a lead-acid battery may also be in the form of a wet-cell battery. In this case, the described absorbent glass-fiber mat is dispensed with and the electrolyte, the sulfuric acid, is located in unbound form between the individual plates of the battery. Here, electrical insulation of the plates is usually performed by a separator which is composed of polyethylene. In this case, it is important that the battery does not exhibit any leaks since otherwise escaping sulfuric acid could lead both to damage inside the battery and outside the battery.

Voltages of lead-acid batteries are conventionally only measured as a total voltage. The individual voltages of the individual cells, which together form the lead-acid battery, are not measured. Therefore, fault diagnosis is made more difficult when, for example, the aim is to ascertain whether one of the individual cells of a lead-acid battery is defective and which of the individual cells of a lead-acid battery is defective.

DE 603 14 825 T2 describes an apparatus for charging and monitoring a motor-vehicle starter battery. In this case, individual voltages are tapped off. However, measurement and diagnosis take place centrally. One disadvantage of an arrangement of this kind is that openings have to be formed in the battery for the supply lines for the taps to the individual electrodes. These openings are generally susceptible to corrosion and leakages. However, leakages would lead to the problems described above. In addition, an arrangement of this kind is relatively complex in respect of manufacture since some production steps have to be modified or added. Integration into a conventional manufacturing process, and therefore industrial feasibility, is therefore possible only with difficulty and is laborious.

Consequently, the object of the invention is to develop a lead-acid battery having a plurality of individual cells, it being possible to easily monitor the function of the lead-acid battery and the lead-acid battery being easy to manufacture and at the same time being robust.

This and other objects are achieved according to the invention by a lead-acid battery having a plurality of individual cells, and a plurality of measurement circuits which are mounted on the respective individual cells in a manner integrated in the lead-acid battery. The measurement circuits are designed to measure a respective individual cell voltage. A method is also provided for measuring individual cell voltages of the lead-acid battery.

The lead-acid battery according to an embodiment of the invention has a plurality of individual cells and a plurality of measurement circuits, also called voltage measurement devices, which are mounted on the respective individual cells in a manner integrated in the lead-acid battery and which are designed to measure a respective individual cell voltage.

In the method according to an embodiment of the invention for measuring individual cell voltages of a lead-acid battery having a plurality of measurement circuits which are integrated in the battery and are arranged on the individual cells, the respective individual cell voltages are measured using the measurement circuits.

The lead-acid battery according to the invention preferably has cell connectors which electrically connect the positive electrodes and the negative electrodes of the individual cells, wherein the measurement circuits are each electrically connected to the cell connectors. The measurement circuits can be fixed, for example, on the cell connectors, also called flag connectors. Said measurement circuits can also be arranged between the flag connectors. The measurement circuits can be fixed, for example, by welding, soldering or adhesive bonding. The measurement circuits are preferably arranged on printed circuit boards which, for their part, are fixed to the cell connectors in the explained manner.

The measurement circuits each particularly preferably have at least one contact-maker which electrically contact-connects the respective measurement circuit to at least one cell connector. The contact-maker can be, for example, a flexible contact-maker. Particularly in the case of a wet-cell battery, it is advantageous when the contact-maker is acid-resistant.

In a particularly practical variant of the lead-acid battery according to the invention, the measurement circuits each comprise an energy supply interface which is electrically connected to the cell connectors.

Since the electrical voltage available from the individual cells amounts to only approximately 2 V, it is expedient that the measurement circuits each comprise a charge pump with which a supply voltage which is applied to the energy supply interface of the respective measurement circuit can be increased, since measurement circuits are usually operated with higher voltages than 2 V. As an alternative or in addition, the energy supply interface can also be electrically connected to an auxiliary battery as energy supply. As a further alternative or in further addition, the energy supply interface can be electrically connected to an inductive energy transmission component by which the measurement circuit is supplied with electrical energy in a wireless manner. In this variant of the energy supply, the electrical energy can be transmitted to the measurement circuit, for example, by use of a reading-out device. While the measurement data which is detected by the measurement circuit is detected, for example in an inductive or capacitive manner, by the reading-out device, energy is at the same time transmitted, for example in an inductive or capacitive manner, to the measurement circuit.

By way of example, the measurement circuits each include a microcontroller for processing and/or storing measurement data. A microcontroller comprises both a processor and also peripheral units on a chip and is normally matched to a specific task field. The use of the microcontroller allows efficient and cost-effective data processing. Measurement data can optionally be stored by the measurement circuit. As an alternative, measurement data can also be stored externally, that is to say outside the cells of the lead-acid battery.

The current cell voltage can be detected in a cascaded manner for example. This means that a current cell voltage is measured or detected only up to a degree of accuracy which is defined by two threshold values. In the case of this kind of data detection, data processing and transmission can be realized with a low level of expenditure or in a narrow band. As an alternative, continuous cell voltage measurement, that is to say measurement of exact voltage values of the individual cells, can also be implemented. It may possibly also suffice to provide only some of the cells with measurement circuits and to measure only the cell voltages of some of the cells. By way of example, when there are six cells, it suffices to measure only the voltage of five cells and to calculate the voltage of the sixth cell from the total voltage.

The individual measurement circuits can each include a data transmission device for transmitting measurement data in a wire-free manner. In this case, data transmission can be realized by modulation of a carrier signal with a measurement value. The type of modulation used can be, for example, amplitude modulation or frequency modulation, pulse code modulation or the like. As an alternative, data transmission can also be realized with the aid of a change in frequency. Thereby, discrete measurement values can be coded by means of frequency assignment. Cascading (combination) of measured voltage values to form voltage ranges can be realized here. These ranges are output over defined frequencies. In an alternative variant of the arrangement according to the invention, data transmission can also take place by means of Radio Frequency Identification (RFID). Using this technology, data is transmitted in a contact-free manner and without visual contact from a data carrier, the so-called transponder or tag, to an RFID reading device and vice versa. An idea on which the invention is based is carrying out the voltage measurement of the individual cell voltages without adversely affecting the encapsulation of the battery. Therefore, additional data transmission lines are advantageously avoided in line with this concept owing to the use of wire-free data transmission.

The lead-acid battery according to the invention may, for example, be in the form of a wet-cell battery, in the form of an AGM battery or in the form of a lead-gel battery. An AGM battery is intended to be understood to mean lead-acid batteries with absorbent mat separators which were discussed in detail in the introductory part. Particularly in the case of the design as an AGM battery, rapid diagnosis of a conventional lead-acid battery does not function in a reliable manner. However, reliable diagnosis can be ensured with the measurement according to the invention of individual cell voltages.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
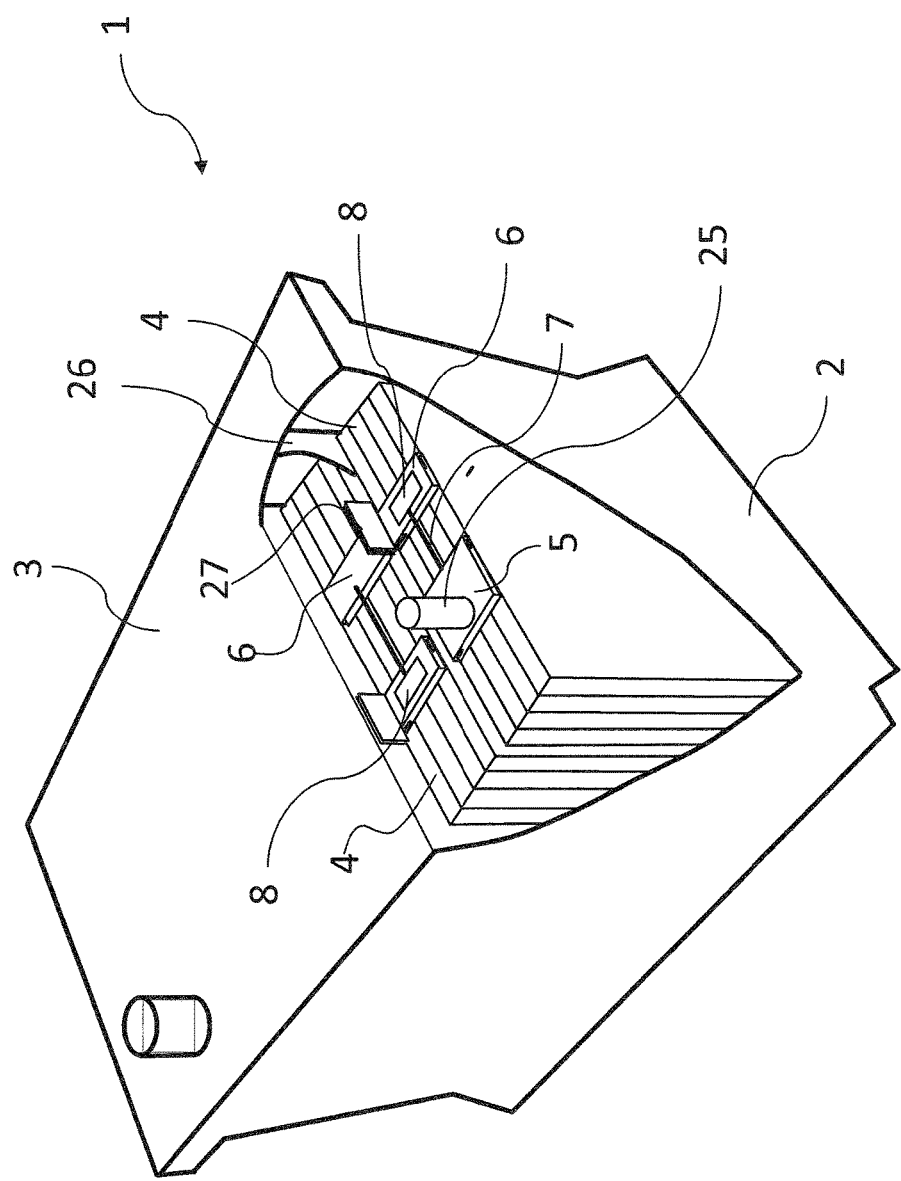
FIG. 1 is a schematic illustration of a lead-acid battery according to an exemplary embodiment of the invention.

FIG. 1 shows a perspective view of an open and sectioned lead-acid battery 1 according to an exemplary embodiment of the invention. The battery 1 has a housing 2 in which a plurality of cells 4, each having a plate set with positive and negative plates, is arranged. The cells 4 are each separated from one another by separating walls 26, but are electrically connected by way of cell connectors which are formed by electrodes 6 and intercell connectors 27 which run on the plate sets. The cells 4 are alternately welded-through by means of intercell connectors 27, so that the individual cells 4 are connected in series. A positive electrode contact pole 25 can be seen in the foreground. The positive electrode contact pole is connected to a generator and electrical assemblies to which power is to be supplied, for example in the on-board vehicle electrical system. A voltage measurement device 8 is arranged on the negative electrode 6. The voltage measurement unit comprises, for example, a measurement contact for a positive voltage (not shown) and a measurement contact for a negative voltage (not shown). In this case, the measurement contact for a positive voltage is directly electrically connected to the positive electrode 5 by way of an electrical connecting line 7, and the measurement contact for a negative voltage is directly electrically connected to the negative electrode 6. Further voltage measurement devices are located on the other cells. For example, a second voltage measurement device 8 can be seen on the positive electrode of a second cell 4. The voltage measurement devices 8 can additionally also have an energy supply interface (not shown) with contacts for electrical energy to be supplied to them. In this case, the voltage measurement devices 8 can draw the energy directly from the cells 4 which are respectively associated with them by way of the contacts for voltage measurement.

Furthermore, FIG. 1 shows a cover 3 of the lead-acid battery 1, which cover can be welded to the housing 2 in order to hermetically seal off the battery 1, so that no electrolyte can escape.

Figure 2:
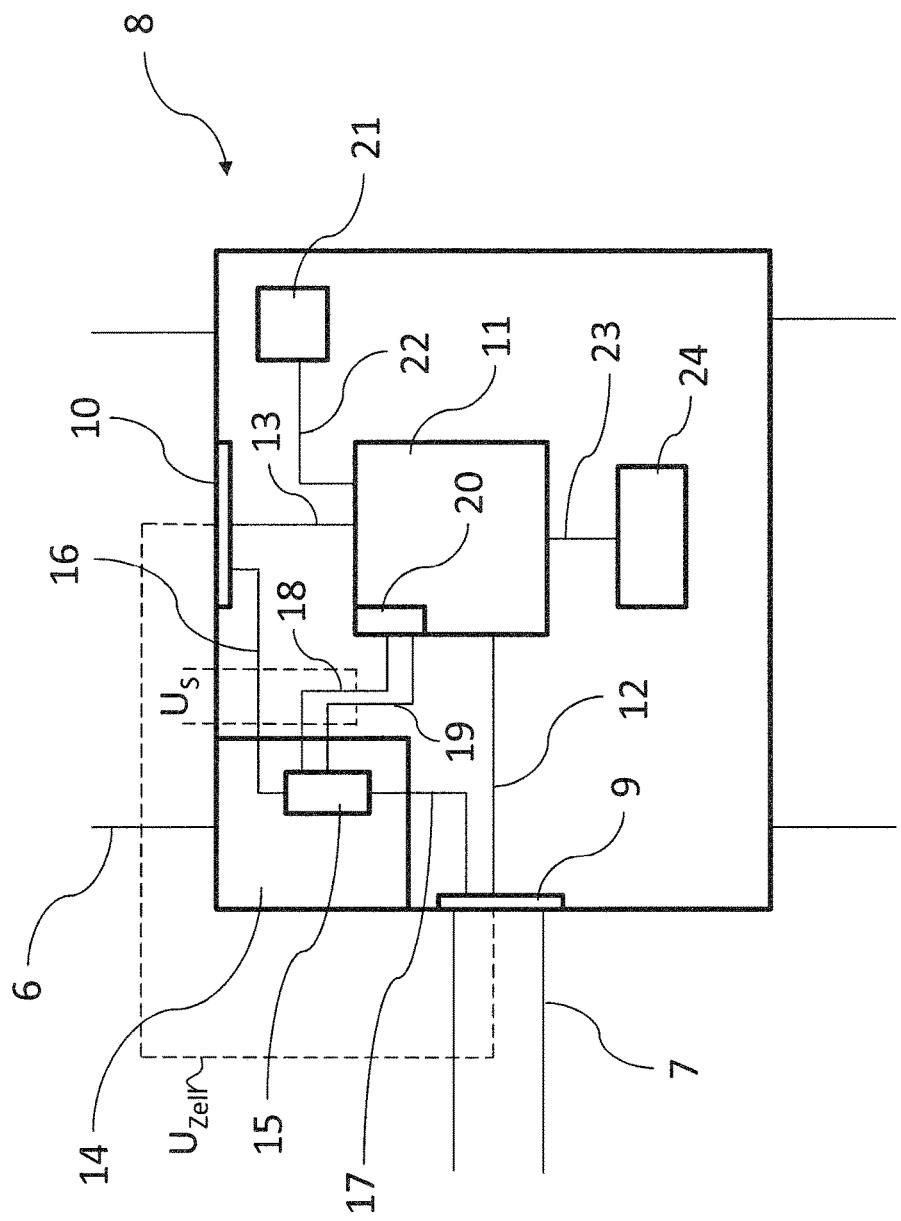
FIG. 2 is a schematic illustration of a voltage measurement device according to an exemplary embodiment of the invention.

FIG. 2 illustrates, in detail, one of the voltage measurement devices 8 shown in FIG. 1. The voltage measurement device 8 shown includes a first measurement contact 9 which is electrically connected to the electrical connecting line 7 to a positive electrode 5 (not shown) of a cell. The voltage measurement device 8 has a second measurement contact 10 which is electrically connected to a negative electrode 6 (not shown) of a cell 4 (not shown). The potentials of the electrodes 5, 6, which potentials are detected at the measurement contacts 9, 10, are transmitted to a microcontroller 11 by way of transmission lines 12, 13. The microcontroller 11 processes the detected potential data. By way of example, the detected information is converted into digital data and then evaluated. For example, a cell voltage $U_{cell}$ is determined from the detected potentials of the electrodes of the cell. The determined data is then processed further. By way of example, the determined cell voltage or the determined cell voltage value $U_{cell}$ is stored, together with an associated time $t_{measure}$, in a data memory 21. In addition, the determined or stored data is transmitted to an external data detection device (not shown), which is positioned outside the lead-acid battery, by means of a radio data transmission unit 24. The radio data transmission unit 24 can, for example, be in the form of an RFID data transmission device. The radio data transmission unit 24 is connected to the microcontroller 11 by way of a data transmission line 23.

Furthermore, the voltage measurement device 8 can have an energy supply interface 14. The energy supply interface 14 is electrically connected to the measurement contacts 9, 10, for example, by way of contact lines 16, 17. Since, for example, only a voltage $U_{measure}$ of approximately 2 V is applied to an individual cell of a lead-acid battery, but the electronic components of the measurement circuit 8 usually require a higher supply voltage, the voltage $U_{measure}$ which is tapped off at the measurement contacts 9, 10 is transformed to a higher supply voltage $U_s$ in a charge pump 15. The higher supply voltage corresponds to a voltage with which, for example, the microcontroller 11 can be operated. The electrical supply voltage $U_s$ generated is applied to a supply voltage interface 20 of the microcontroller 11 by way of supply voltage lines 18, 19. If necessary, further electronic components can also be supplied with electrical energy by means of the energy supply interface 15. As an alternative, the cell voltage to be measured can also cause mechanical changes to elements. This change can then be transmitted and evaluated in a contact-free manner as an (analog) state indicator.

Figure 3:
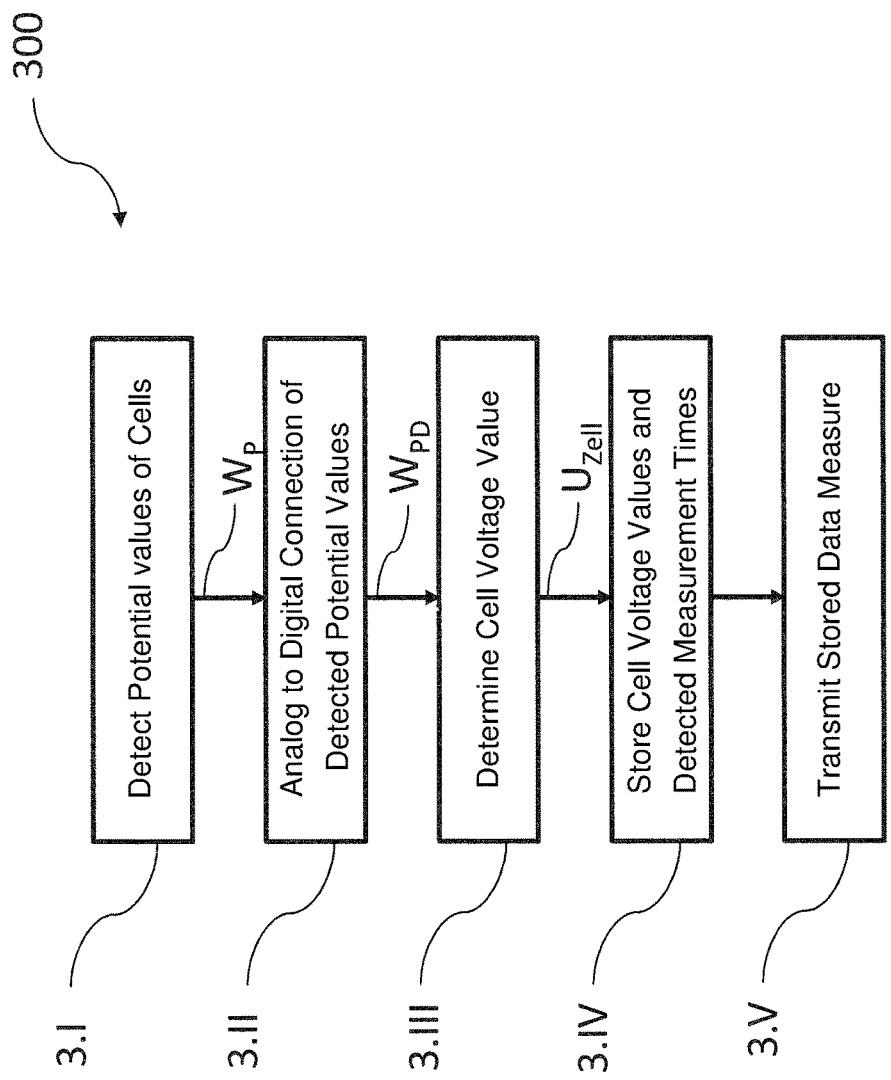
FIG. 3 is a flowchart of a measurement method according to an exemplary embodiment of the invention.

FIG. 3 illustrates a flowchart showing a method for measuring individual cell voltages of a lead-acid battery having a plurality of measurement circuits which are integrated in the battery and arranged on the individual cells, according to an exemplary embodiment of the invention. In step 3.I, the potential values $W_P$, which are applied to the measurement contacts, of the potentials of the electrodes of the individual cells of a lead-acid battery are detected. In step 3.II, the detected values are converted into digital potential values $W_{PB}$. In step 3.III, a voltage value is determined as cell voltage value $U_{cell}$ on the basis of the digital potential values $W_{PB}$. In step 3.IV, the determined cell voltage value $U_{cell}$ is stored together with a detected measurement time $t_{measure}$. A plurality of measurement data items which are detected over a specific time period and are stored form a measurement data set $D_{measure}$. In step 3.V, the detected and stored measurement data or a stored measurement data set $D_{measure}$ which comprises, in particular, the determined and stored cell voltage values $U_{cell}$ and measurement times $t_{measure}$ for a specific time period are transmitted to an external data detection device.

Finally, it is once again pointed out that the components illustrated in the figures and the method described in detail are merely exemplary embodiments which can be modified in many respects. Furthermore, for the sake of completeness, it is also pointed out that the use of the indefinite articles "a" and "an" does not preclude the features in question from also being present several times. Similarly, the term "unit" does not preclude this from also consisting of a plurality of subunits.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A lead-acid battery, comprising:
   a plurality of individual plate block cells separated by separating walls extending internal to a common housing of the lead-acid battery, each cell comprising: a positive plate set having a positive electrode, and a negative plate set having a negative electrode; and
   a plurality of measurement circuits, each measurement circuit being mounted on a respective individual cell in a manner integrated in the lead-acid battery,
   wherein the measurement circuits are configured to measure a respective individual cell voltage.

2. The lead-acid battery according to claim 1, further comprising:
   cell connectors which electrically connect the positive electrodes and the negative electrodes of the plurality of individual cells, wherein the measurement circuits are each electrically connected to the cell connectors.

3. The lead-acid battery according to claim 2, wherein the measurement circuits each comprise at least one contact-maker that electrically contact-connects the respective measurement circuit to at least one cell connector.

4. The lead-acid battery according to claim 3, wherein the measurement circuits each comprise an energy supply interface electrically connected to the cell connectors.

5. The lead-acid battery according to claim 2, wherein the measurement circuits are each mounted on one of the cell connectors.

6. The lead-acid battery according to claim 5, wherein the measurement circuits each comprise an energy supply interface electrically connected to the cell connectors.

7. The lead-acid battery according to claim 1, wherein the measurement circuits each comprise a charge pump with which a supply voltage applied to an energy supply interface of the measurement circuit is increasable.

8. The lead-acid battery according to claim 1, wherein the measurement circuits each comprise an energy supply interface which is electrically connected to an auxiliary battery as an energy supply.

9. The lead-acid battery according to claim 1, wherein the measurement circuits each comprise an energy supply interface which is electrically connected to an inductive energy transmission component by which the measurement circuit is supplied with electrical energy in a wireless manner.

10. The lead-acid battery according to claim 1, wherein the measurement circuits each have a microcontroller for processing and/or storing measurement data.

11. The lead-acid battery according to claim 10, wherein the measurement circuits each comprise a data transmission device for transmitting measurement data in a wireless manner.

12. The lead-acid battery according to claim 1, wherein the measurement circuits each comprise a data transmission device for transmitting measurement data in a wireless manner.

13. The lead-acid battery according to claim 1, wherein the battery is a wet-cell battery, an AGM battery or a lead-gel battery.

14. A method for measuring individual cell voltages of a lead-acid battery comprising a plurality of individual plate block cells separated by separating walls extending internal to a common housing of the lead-acid battery, each cell comprising: a positive plate set having a positive electrode, and a negative plate set having a negative electrode, the method comprising the acts of:
   providing a plurality of measurement circuits, each measurement circuit being mounted on a respective individual plate block cell of the lead-acid battery; and
   measuring the individual cell voltages via the plurality of measurement circuits.

* * * * *